United States Patent [19]

Celler et al.

[11] Patent Number: 4,497,683
[45] Date of Patent: Feb. 5, 1985

[54] PROCESS FOR PRODUCING DIELECTRICALLY ISOLATED SILICON DEVICES

[75] Inventors: George K. Celler, New Providence; McDonald Robinson, Chester, both of N.J.

[73] Assignee: AT&T Bell Laboratories, Murray Hill, N.J.

[21] Appl. No.: 374,308

[22] Filed: May 3, 1982

[51] Int. Cl.$^3$ .......................... C30B 25/10; B05D 5/12
[52] U.S. Cl. .................................... 156/603; 156/613;
156/DIG. 64; 156/DIG. 80; 156/DIG. 111;
427/53.1; 427/87; 427/95
[58] Field of Search .................... 156/613, 614, 617 R,
156/DIG. 64, DIG. 80, DIG. 111, DIG. 73,
DIG. 88, 620, 603; 427/86, 95, 93, 53.1;
148/1.5, 175

[56] References Cited

U.S. PATENT DOCUMENTS

| | | | |
|---|---|---|---|
| 3,177,100 | 4/1965 | Mayer et al. | 156/613 |
| 3,206,339 | 9/1965 | Thornton | 156/613 |
| 3,409,483 | 11/1968 | Watson | 156/613 |
| 3,549,432 | 12/1970 | Silvertsen | 156/DIG. 80 |
| 3,655,439 | 4/1972 | Seiter | 427/86 |
| 3,945,864 | 3/1976 | Goldsmith et al. | 156/613 |
| 4,046,618 | 9/1977 | Chaudhari et al. | 156/617 R |
| 4,292,091 | 9/1981 | Togei | 427/53.1 |
| 4,323,417 | 4/1982 | Lam | 156/613 |
| 4,371,421 | 2/1983 | Fan et al. | 156/617 R |
| 4,383,883 | 5/1983 | Mizutani | 156/DIG. 80 |
| 4,389,481 | 6/1983 | Poleshuk et al. | 427/86 |
| 4,395,433 | 7/1983 | Nagakubo et al. | 156/603 |

FOREIGN PATENT DOCUMENTS

| | | | |
|---|---|---|---|
| 123988 | 11/1974 | Japan | 427/95 |
| 68897 | 6/1977 | Japan | 156/DIG. 111 |
| 23781 | 3/1981 | Japan | 427/86 |

*Primary Examiner*—David L. Lacey
*Attorney, Agent, or Firm*—Bruce S. Schneider

[57] ABSTRACT

Dielectrically isolated semiconductor devices are producible through a relatively convenient fabrication procedure. In this fabrication procedure, a substrate having regions of single crystal silicon and regions of silicon oxide is employed. Such substrate is expeditiously produced by methods which leave the surface of the single crystal regions below those of the silicon oxide regions. Silicon is deposited by CVD onto the structure with its regions of silicon dioxide and single crystal silicon. Initially, the conditions of the CVD procedure are controlled so that epitaxial silicon grows on the regions of single crystal silicon but essentially no growth is induced on the silicon oxide regions. When the growth of the single crystal regions has proceeded sufficiently to produce a substantially planar structure, advantageously the deposition conditions are adjusted so that silicon is also deposited on the surface of the silicon oxide. The polycrystalline or amorphous silicon layer overlying regions of silicon oxide produced from this growth is then converted into single crystal silicon.

6 Claims, 6 Drawing Figures

PROCESS FOR PRODUCING DIELECTRICALLY ISOLATED SILICON DEVICES

BACKGROUND OF THE INVENTION

1. Field of the Invention

This invention relates to semiconductor devices and, in particular, to dielectrically isolated semiconductor devices.

2. Art Background

In most electronic components, such as integrated circuits, electrical isolation is produced between regions of essentially single crystal silicon by junction isolation. (Single crystal silicon is silicon having defects, e.g., linear and planar defects such as dislocations or stacking faults, respectively, in a density through the crystal of less than $10^8$ defects per $cm^{+2}$.) In this junction approach, lateral isolation is accomplished by interposing between the active single crystal silicon regions, a region of opposite electrical type from that of the active region. The thickness of this added region is approximately equal to the depth of the active regions of the single crystal materials being separated. Similarly, vertical isolation in the junction isolation approach is obtained by the presence of material of opposite conductivity type positioned below the active region. (The active region is that portion of the single crystal silicon which is ultimately modified to contain electronic device structures. The active region is typically 1 $\mu$m thick for nominal voltage devices.) Such rectifying junctions formed at the boundaries of the active regions, provide lateral and vertical isolation when appropriately biased.

For some applications lateral junction isolation is replaced with lateral dielectric isolation to save space and to reduce capacitance. (Lateral dielectric isolation entails the presence of an insulator rather than a material of opposite conductivity type at the lateral boundaries of the active region.) By expedients such as junction isolation or lateral dielectric isolation, transistors or other devices formed in one single crystal region, i.e., one active region, are electrically isolated and are prevented from interacting with devices in a second active region.

However, for some significant applications the use of junction isolation, or a combination of junction and lateral dielectric isolation, is not sufficient. For example, in some instances, the voltage employed in operation is often large enough to cause electrical breakdown between separate active regions. This electrical breakdown occurs through many paths such as by the penetration of charge carriers below one active region through the underlying substrate, across the substrate under the lateral isolation region, and into the second active region. When a typical junction isolation structure is employed, the voltages encountered in some applications, such as telephone line interface circuits, are sufficient to cause breakdown by charge carrier penetration through the isolating regions. To prevent such undesirable electrical interaction between two active regions, a combination of lateral and vertical dielectric isolation is employed. This dielectric isolation is provided by surrounding the single crystal silicon regions with an electrically insulating dielectric material. By this expedient, interaction between active regions even at high voltages is avoided.

Vertical dielectric isolation is also advantageously used in devices operating at nominal voltages where enhanced reliability is desirable. The additional insulating material that provides the vertical dielectric isolation also prevents electron-hole pairs formed in the underlying substrate by thermal processes or by ionizing radiation from migrating to an active region and, therefore, introducing errors in the processing of information by the electronic devices in this region. Additional advantages are also available by replacing junction isolation completely with dielectric isolation. Typical junction isolation introduces significant capacitance into the structure. It is possible in theory to increase the insulating capability of junction isolation to prevent breakdown in high-voltage devices. However, a high-voltage application requires a correspondingly high resistivity in the junction isolation region. Since the size of the depletion region increases with both voltage and resistivity, enhanced breakdown characteristics require an extremely large volume devoted to isolation. This large volume imposes a penalty both in the required volume per device and in increased parasitic capacitance. The substitution of dielectric isolation for junction isolation greatly reduces the area requirement, thereby reducing cost and also reduces capacitance, allowing faster device operation.

A variety of processes have been employed to produce semiconductor components having dielectric isolation. These processes are designed not only to produce dielectric and lateral isolation but also to produce a relatively planar surface upon which further processing is performed to form devices in the active regions. (If the surface is not planar, subsequent device processing is considerably complicated.) For example, a dielectric isolation process to produce relatively thick active regions is described by K. E. Bean and W. R. Runyan, *Journal of the Electrochemical Society*, 124, 50 (1977). However, because of the strictures imposed by the requirements of dielectric isolation and planarity, this process involves a large number of complicated steps and introduces a high density of crystal defects and impurities. Thus, the manufacturing yields are low and costs are high for defect and impurity-sensitive devices fabricated by this process.

Procedures are also available for producing dielectrically isolated active regions which are relatively thin. The most widely investigated techniques among these procedures are those processes commonly denoted silicon on sapphire. For such processes, silicon is grown on an electrically insulating sapphire substrate by a chemical vapor deposition (CVD) method. The silicon produced often has a substantial defect density. Thus, within a production run, only a relatively small percentage of the silicon deposited on the sapphire is suitable for device applications. The resulting low yields, together with the substantial cost of the polished sapphire substrate, make the devices which are produced relatively expensive.

SUMMARY OF THE INVENTION

The use of a particular sequence of processing steps allows the relatively expeditious and reliable production of vertical and lateral dielectrically isolated, planar, single crystalline silicon semiconductor regions. In this procedure as a first step, a body whose surface includes both regions of single crystal silicon and regions of silicon oxide is first formed by conventional and relatively uncomplicated techniques. (See, for example, copending, coassigned U.S. patent application Ser. No.

231,238 filed Feb. 4, 1981, which is hereby incorporated by reference.) This body, such as shown in FIG. 1, although expeditiously formed, is not planar and has the surface of its single crystal silicon region(s), 4, at a level below that of the surface of the insulating silicon oxide region(s), 5. To produce a planar structure which is desirable for the ultimate conversion of, for example, polycrystalline silicon into single crystal silicon in subsequent steps, a selective CVD procedure is then employed. By using specifically chosen deposition conditions, epitaxial single crystal silicon is deposited on the single crystal silicon region(s) without any substantial deposition on the silicon oxide region(s). This deposition is continued until the surface of the single crystal silicon region(s) is substantially co-planar with the surface of the silicon oxide region(s). That is, this deposition is continued until the surface of the grown epitaxial silicon material is removed from the surface of the silicon oxide region a distance no more than 50 percent, preferably 10 percent, of the silicon oxide region thickness. (The surface of an epitaxial silicon region or silicon oxide region is defined for this purpose by a linear least-square fitted plane to the surface portion of the region which is removed from the extremities of the region at least a lateral distance equal to the thickness of the silicon oxide region itself, or in the case of a silicon region, the thickness of the closest silicon oxide region. Additionally, the thickness of the silicon oxide region, for the purpose of this determination, is the largest distance through this region measured on a line perpendicular to the major surface of the substrate.) When the silicon region(s) becomes substantially co-planar with the silicon oxide region(s), silicon is deposited on the silicon oxide as well as the single crystal silicon. The method utilized for this indiscriminate deposition is not critical. However, the deposition is conveniently performed by adjusting the deposition conditions initially employed so that silicon begins to form on the region(s) of silicon oxide and so that silicon continues to form on the region(s) of single crystal material. (The silicon formed on the silicon oxide region(s) is not single crystalline and is generally either polycrystalline or amorphous.) The deposition process is then discontinued when the thickness of the silicon on the oxide region(s) above the plane of the silicon oxide surface reaches a thickness typically in the range 1000 Å to 100$\mu$, preferably 0.3$\mu$ to 3$\mu$. (As the non-single crystalline region gets thicker during deposition by CVD, the planarity between the polycrystalline and single crystal region surface decreases somewhat. Although this planarity between single crystal and non-single crystal region(s) is not essential, even for quite thick polycrystalline layers the degree of planarity which is produced allows advantageous conversion to single crystal material and subsequent device processing. Indeed, some deposition techniques result in the non-single crystal region overlying the single crystal region. Such a configuration is also acceptable.) The single crystal region(s) is then employed as a nucleation site to transform the polycrystalline silicon material into single crystal silicon material through processes such as laser beam, electron beam, and strip heater recrystallization. By this relatively convenient processing sequence a body having a single crystal silicon region(s) overlying a silicon oxide region(s) is produced.

Notably, through the control and appropriate adjustment of the conditions employed in the CVD process, a suitable structure is produced without extensive processing. Not only is the production of this structure with single crystal region extending to or above the surface of the silicon oxide regions simplified by the subject invention, but also such a structure simplifies the subsequent step of transforming the polycrystalline or amorphous silicon into dielectrically isolated single crystal material. Thus, by a relatively convenient and inexpensive fabrication procedure, it is possible to produce advantageous dielectrically isolated regions of single crystal silicon.

DETAILED DESCRIPTION

Figure 1:
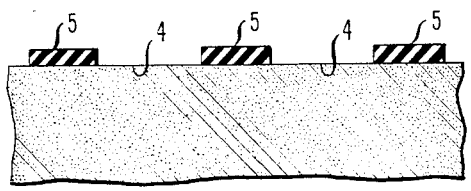
FIGS. 1–3 illustrate structure configurations involved in the inventive process.

As previously discussed, the inventive process involves the processing of a substrate that is relatively easily fabricated. This substrate includes a surface having one or more regions of single crystal silicon and one or more regions of silicon oxide. Additionally, to allow the expeditious fabrication of this substrate, at least one of its regions of single crystal silicon is not co-planar with at least one of its regions of silicon oxide. In particular, the surface which is to undergo treatment has at least one region of single crystal silicon which is below an imaginary plane which includes the surface of a silicon oxide region. (In the context of this disclosure, a plane includes a surface of a material if it represents a linear least-square-fit to the points on this surface. Additionally, the single crystal surface is below the plane of the oxide if it is entirely on one side of the plane representing the linear least-square-fit to the oxide surface.) The fabrication of such substrates has been described in co-pending U.S. application, Ser. No. 231,238 filed Feb. 4, 1981 which is hereby incorporated by reference. Such a suitable substrate is fabricated by a variety of relatively convenient techniques. For example, a single crystal region of silicon is masked utilizing a material such as silicon nitride through conventional deposition and lithographic procedures. (See, for example, J. Hui et al, *IEEE Electron Device Letters*, EDL-2, 244 (1981) for a description of the fabrication of a silicon nitride mask.) The mask is formed so that the portions of the substrate that are to be single crystal silicon regions are covered by the masking material while the remaining portions are left uncovered. The uncovered areas of single crystal silicon are then oxidized through conventional oxidation techniques such as thermal oxidation. (Thermal oxidation is well known and is fully described in Roy A. Colclaser, *Microelectronics: Processing and Device Design*, Chapter 5, John Wiley and Sons, New York 1980.) Upon oxidation the uncovered surface of silicon, with the adjoining material directly below it, expands in volume and is transformed into silicon oxide. When the masking material is removed through the use of a suitable solvent, e.g., hot phosphoric acid for a silicon nitride delineating material, the structure of FIG. 2 is obtained where the regions denoted 6 are regions of single crystal silicon and the regions denoted 7 are regions of silicon oxide i.e., $SiO_x$ where $0 < X \leq 2$.

Alternatively, a substrate used in the inventive technique is produced by first forming a layer of oxide on at least a portion of the surface of a single crystal silicon substrate. Such silicon oxide layers are deposited by conventional techniques such as low-pressure chemical deposition as discussed by R. S. Rosler, *Solid State Technology*, pp. 63–70, April 1977 or produced by thermal oxidation as previously described. The silicon oxide layer is then delineated by conventional techniques such as lithographic techniques, e.g., photolithography. The delineation is performed so that the regions in the final substrate that are to be silicon oxide are covered while the remaining regions of the silicon oxide layer are not covered by the delineating material. The uncovered regions of silicon oxide are then etched, e.g., by using an HF base etchant, so that the entire thickness of the uncovered silicon oxide region is removed. This process results in a substrate such as that shown in FIG. 1 where the regions denoted 4 are regions of single crystal silicon and the regions denoted 5 are regions of silicon oxide. (The regions of silicon oxide need not directly contact the regions of single crystal silicon. Structures for example where another dielectric material contacts the single crystal silicon region and the silicon oxide overlies and contacts the dielectric material are also useful.)

Figure 2:
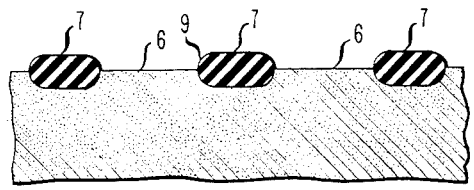

As can be seen, substrates employed in the subject invention having configurations such as shown in FIGS. 1 and 2 are easily obtained. As shown in FIG. 2, at 9, oxides that are formed through thermal oxidation have rounded walls at their extremities. In contrast, oxide regions that are etched, typically have relatively straight walls at their extremities. (Straight in this context does not necessarily refer solely to vertical but merely refers to essentially planar walls.) The particular geometry of the extremities of the silicon oxide regions is not critical. The inventive process is employed, irrespective of such geometry.

After the substrate is prepared, an epitaxial deposition of silicon onto the single crystal regions is performed while substantially avoiding the deposition of silicon onto the silicon oxide regions. This objective is accomplished despite the absence of any material such as a delineating material to protect the silicon oxide regions. To achieve this selective deposition of silicon, the conditions of the deposition process are carefully controlled. In this respect, a CVD process is advantageously employed. A deposition vapor containing a silicon source, e.g., $SiCl_4$, $SiHCl_3$, $SiH_2Cl_2$ or $SiH_4$ and a carrier gas containing a suitable reactant gas, e.g., $H_2$, and/or an inert gas such as He is utilized. (An inert gas is one which neither reacts with the silicon source gas or with the substrate.) The reactant gas is chosen to react with the source of silicon under the influence of the heated substrate to cause deposition of elemental silicon. For example, hydrogen reacts with $SiCl_4$, $SiHCl_3$ and $SiH_2Cl_2$ to deposit silicon. However, silicon sources such as $SiH_4$ yield deposited silicon under the influence of the heated substrate without the presence of a reactant gas.

An etchant for silicon oxide, e.g., HCl, should also be present in the deposition vapor to prevent nucleation of polycrystalline silicon on the silicon oxide. This prevention occurs because the etchant decreases the driving force available for nucleation of silicon on the silicon oxide. Sufficient etchant should be introduced to produce the desired decrease in driving force. Alternatively, nucleation on the oxide can be avoided in deposition from $SiH_4$ by depositing at high temperatures (greater than or equal to 1200 degrees C.). At such high temperatures, the driving force for nucleation is reduced by removal of silicon from the oxide by the reaction $SiO_2 + Si \rightleftharpoons 2\ SiO(g)$ [P. Rai-Choudhury and D. K. Schroder, *Journal of the Electrochemical Society*, 118, 107 (1971)]. Therefore, in essence, the oxygen from the $SiO_2$ acts as an in situ etchant. Irrespective of the etchant employed, its concentration should not be sufficient to (1) cause substantial removal of the silicon oxide, i.e., removal of more than 10 percent of the oxide layer during silicon deposition or (2) to cause continuous etching of the single crystal silicon region. It is possible to introduce the etchant by direct addition, e.g., the addition of HCl. Alternatively, it is possible to introduce the etchant in situ as a by-product of the silicon deposition reaction. For example, if $SiCl_4$ is used, the deposition reaction $SiCl_4 + 2H_2 \rightleftharpoons Si + 4HCl$ produces the necessary etchant. When the etchant is formed in situ, the conditions generally appropriate for epitaxial silicon formation yield an appropriate level of etchant. When etchant is added, etchant partial pressures in the range 0.001 to 0.1 atm are generally appropriate. The total deposition vapor flow rate over the substrate should generally be in the range 30 to 200 l/min at one atmosphere total pressure. If the total pressure is reduced, the total flow rate should be reduced proportionally. However, it is usually not desirable to employ a total pressure less than 0.001 atm. The partial pressure of the silicon source should be in the range 0.001 to 0.05 atm, with the balance of the deposition vapor being either an inert gas or a reactive gas such as hydrogen.

The substrate is maintained at a temperature in the range 1050 degrees C. to 1250 degrees C. Higher temperatures below the melting point of silicon although not precluded, are unnecessary and uneconomical, while lower temperatures lead to degraded single crystal silicon quality and to nucleation of polycrystalline silicon on the silicon oxide. Through the use of such conditions, growth of epitaxial silicon proceeds on the single crystal silicon regions and formation of silicon is substantially avoided on the exposed surface of the silicon oxide regions. (It is possible that some scattered nucleation occurs on the silicon oxide but substantial growth is avoided.)

Figure 3:
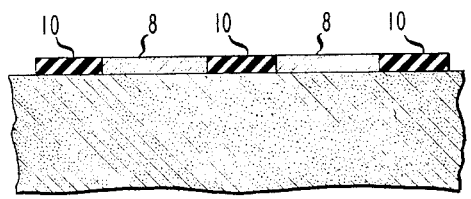

At an appropriate time, the selective growth of an epitaxial silicon region is converted to an indiscriminate growth, i.e., silicon growth on both the single crystal silicon regions and on the silicon oxide regions. This conversion is initiated when the surface of the epitaxial layer 8 in FIG. 3 is substantially co-planar with the surface of the silicon oxide regions, 10. To achieve this result, generally, the selective growth should be terminated before substantial co-planarity is achieved. Even if the conditions leading to the selective epitaxial silicon growth process are instantaneously terminated and conditions favoring indiscriminate growth on all surfaces of the substrate instantaneously initiated, typically residual selective growth continues for a short time period, e.g., 0.5 to 120 seconds. For example, in the case of CVD, despite the relatively rapid change of processing conditions from selected to indiscriminate growth, selective epitaxial growth continues for a short period of time. Therefore, the selective growth should be terminated, e.g., by converting to indiscriminate growth conditions, sufficiently in advance so that planarity is achieved at the time when rapid nucleation of non-single crystal silicon begins on the silicon oxide surface. For example, in the case of CVD utilizing an atmosphere containing $SiCl_4$ and $H_2$, the selective growth should be terminated when the surface of the epitaxial region is within 6000 Å of producing the desired substantial planarity. A suitable time for conversion to indiscriminate growth conditions for a particular deposition atmosphere is easily determined by employing a control sample.

To produce indiscriminate growth, the deposition conditions are adjusted so that the driving force for silicon nucleation on the silicon oxide is high. The method employed for such deposition is not critical. Conventional techniques such as electron beam evaporation are acceptable. (See *Impurity Doping Processes in Silicon*, Ed., F. F. Y. Wang, Chapter 4, "Growth of Doped Silicon Layers by Molecular Beam Epitaxy" by J. C. Bean, North-Holland Publishing Company, Amsterdam, 1981.) However, it is convenient to perform the indiscriminate deposition merely by changing the condition of the CVD process employed for the selective growth. This result is accomplished by increasing the driving force for nucleation on silicon oxide by decreasing the substrate temperature, by reduction of etchant partial pressure, or by a combination of these expedients. The exact conditions for a particular silicon source and reactant are determined by using a control sample. Exemplary of an appropriate conversion is from selective growth utilizing an environment containing $SiCl_4$ and $H_2$ at temperatures in the range of 1150 degrees C. to indiscriminate growth utilizing a deposition temperature in the range 1000 to 1100 degrees C., a gas flow of $SiH_4$ in the range of 0.1 to 1.0 l/min and a gas flow of $H_2$ in the range of 30 to 150 l/min. The formation of non-single crystalline silicon is continued until the polycrystalline silicon layer has a thickness equal to that desired for the final single crystal layer that is to overlie the silicon oxide region. The growth of both the epitaxial and non-single crystal regions is then terminated.

As previously discussed, the non-single crystal silicon region is converted into single crystal silicon by employing the region of single crystal silicon as a nucleating site and propagating this nucleation through the polycrystalline silicon layer. This nucleation and propagation is performed by a variety of techniques. For example, techniques such as described in co-pending U.S. application Ser. No. 231,238 filed Feb. 4, 1981 which is hereby incorporated by reference or in co-pending U.S. coassigned application denoted Celler-Lischner-Robinson 8-1-3, Ser. No. 374,309, filed concurrently with this application which is also hereby incorporated by reference. The particular means of nucleation and propagation is not critical. Although the particular method of nucleation and propagation is not critical, one specific technique has been shown to be especially advantageous for non-single crystal layers having a thickness less than 3 µm. In this technique, the substrate is typically heated to a temperature in the range 300 to 500 degrees C. (Higher temperatures reduce stress in film and are useful to reduce the laser power employed. These higher temperatures are not precluded and are useful when laser power is limited. However, the temperature employed with this laser technique should not be so high as to induce substantial oxidation of silicon or by itself to induce melting.) A laser beam is then translated, first across at least a portion of the single crystal region and subsequently across the polycrystalline region to induce the transformation of polycrystalline or amorphous silicon to single crystal silicon. Advantageously, the shape of the beam employed is elliptical with the ratio between the major and minor axes of the ellipse in the range 3:1 to 10:1. (Although ratios above 10:1 are not precluded, typically for conventionally available laser power and at substrate temperature in the range 300 to 500 degrees C., a longer major axis is not practical since the energy density at the extremity of the ellipse for a longer major axis, is generally not sufficient to induce melting.) Typically, the major axis of the ellipse should have a length in the range 50 to 250 microns. The translational direction of scan should preferably be along a major crystallographic direction. For example, if the substrate employed has its major surface in the {100} plane, then a suitable direction of scan is in the <100> direction or alternatively at an angle of 45 degrees to the <100> direction, so that the ellipse is translated in the <110> direction. (A translation in the <100> direction appears to yield slightly diminished defect densities from a scan in the <110> direction.) Irrespective of the particular direction of scan, the major axis of the ellipse should form an angle of between 30 and 60 degrees with this scan direction. Thus, as shown in FIG. 4 which is a plan view of the surface of non-single crystal region, 14, and the surface of single crystal region, 17, the angle 22 between the translation direction as indicated by arrows 20 and the major axis 30 of ellipse 25, should be between 30 and 60 degrees.

Figure 5:
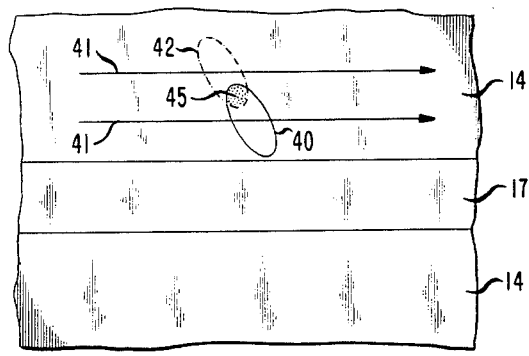

Scan rates in the range from 1 to 5 cm/sec are typically employed. Slower scan rates are inconvenient. Faster scan rates are possible and are not precluded but require higher laser power. The overlap between the areas affected by sequential translations across the wafer should be between 10 to 100 microns. Typically, if the overlap is less than 10 microns the difficulties produced by edge effects are encountered while the use of an overlap greater than 100 microns is generally uneconomical. Thus, as shown in FIG. 5, if ellipse 40 indicates a scan along translational direction 41 and dotted ellipse 42, indicates the subsequent sequential translation, then the longest distance across area 45 common to these two ellipses as denoted by the shaded area should be in the range 10 to 100 microns.

Figure 4:
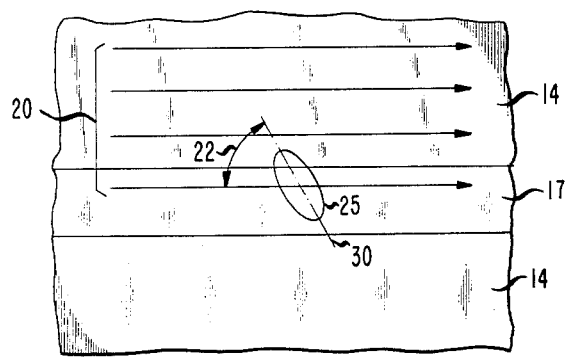
FIGS. 4–6 illustrate an appropriate method of converting non-single crystal silicon into single crystal silicon.
Figure 6:
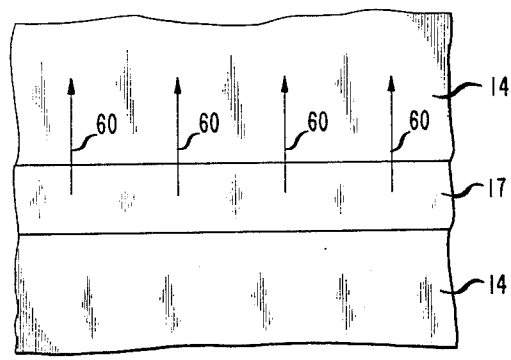

To induce the desired nucleation and propagation, a scan should occur with the ellipse being partially in the single crystal region and partially in the non-single crystal region as denoted by ellipse 25 in FIG. 4. Subsequent scans with the previously discussed overlap, should then occur with the ellipse being translated further and further into the non-single crystal region. By this technique, nucleation occurs when the ellipse straddles the two regions and the nucleation is propagated as the ellipse continues into the non-single crystal silicon region. (Appropriate nucleation is also possible with the scan being done in the direction 60 indicated in FIG. 6. However, the previously described method generally yields superior results.) Although generally it is advantageous to scan the entire substrate, it is possible, if desired, to convert only a portion of the non-single crystal regions of silicon into single crystal silicon.

Typical methods for such nucleation and propagation become inconvenient when the polycrystalline silicon layer is 3 µm or thicker. It is possible to overcome such inconvenience, when a silicon crystal layer overlying the silicon oxide is to be thicker than 3 µm, by using a two-step formation procedure or by using the procedure described in the co-pending Celler-Lischner-Robinson 8-1-3 application. For example, initially a non-single crystal silicon layer having a thickness less than 3 µm is formed as previously described. This region is then converted into single crystal silicon through the nucleation and propagation procedure. The desired total thickness of single crystal silicon is then produced by epitaxially growing single crystal silicon upon the single crystal silicon layer that was converted from the polysilicon deposition. After conversion of the non-single crystal silicon regions, isolation is completed by removing by, for example, etching the silicon material lying laterally between single crystal silicon active regions. Devices are formed in the isolated active region by well-known and conventional techniques. Thus, through a relatively convenient process, dielectrically isolated single crystal silicon is formed.

The following examples are illustrative of the inventive technique.

EXAMPLE 1

A polished silicon wafer 3 inches in diameter having its major surface in the {100} plane was purchased from a commercial supplier. A cleaning solution was prepared by mixing 12.24 kg of concentrated sulfuric acid with 1000 ml of 30 percent hydrogen peroxide. The solution was heated to 100 degrees C. and the wafer was immersed for approximately 10 minutes. The wafer was transferred to a deionized water bath that was heated to 70 degrees C. The water in the bath was exchanged three times and then the wafer was dried by spinning. The wafer was introduced into a furnace heated to 1150 degrees C. The atmosphere of the furnace was produced by bubbling oxygen through a water bubbler heated to 98 degrees C. and introducing the oxygen which was thus saturated with water vapor into the furnace. The treatment of the wafer with oxygen was continued for 6.5 hours to produce a 2 micron thick silicon oxide layer. A 1 micron thick layer of AZ 111 positive resist (a proprietary product of Shipley Company) was spun onto the silicon oxide layer. The resist was exposed with a mercury lamp through a mask which contacted the resist surface. The mask pattern consisted of a series of opaque rectangles of varying sizes which were separated by approximately 50 micron-wide spaces. The resist was then developed in a commercial resist developer. The exposed oxide regions were then etched away by immersing the wafer in a buffered aqueous solution of HF for 30 minutes. The resist was then removed by utilizing a commercial resist stripper, and the wafer was again cleaned utilizing the previously described hydrogen peroxide/sulfuric acid treatment with the associated rinse and drying steps.

The wafer was transferred to the sample holder of an AMV-1200 CVD reactor (sold by Applied Materials, Inc.). The wafer was positioned so that the silicon oxide surface was exposed. The system was purged with dry nitrogen and then with dry hydrogen. The wafers were heated to 1150 degrees C. in dry hydrogen. The hydrogen flow was adjusted to give a flow rate of 95 liters per minute. A flow of 4 g per minute of silicon tetrachloride was introduced into the reactor for 1 minute. The use of this 1 minute treatment resulted in the deposition between the rectangular silicon oxide regions of 1.4 microns of epitaxial silicon onto the exposed regions of single crystal silicon. After the silicon tetrachloride was terminated, the substrate temperature was reduced to 1050 degrees C. and a silane flow of 150 sccm for 8 minutes was introduced. After the 8 minute flow, the introduction of silane was terminated. This procedure resulted in approximately 2.6 microns of polycrystalline silicon overlying the silicon oxide rectangles and an approximately equal thickness of epitaxial silicon overlying the previously deposited epitaxial silicon. The deposition chamber was purged with dry hydrogen for 1 minute, the heating was terminated, and the wafer was allowed to cool in the dry hydrogen atmosphere.

The wafer was then removed from the CVD apparatus and placed on a resistively heated vacuum holder. The wafer was heated to a temperature of 450 degrees C. and the chuck was mounted on an x-y stage that was controlled by a microprocessor. An argon ion laser operating in the multiline mode and having an output power of 15 watts was utilized. The collimated beam from the laser was directed through a beam expander which had an expansion factor of 10 and then was directed through 2 cylindrical lenses which had their axes placed orthogonally to each other. (The cylindrical lens closest to the substrate had a focal length of 20 centimeters while the cylindrical lens furthest from the substrate had a focal length of 30 centimeters.) The beam was then directed onto the wafer so that its axis formed an angle of 10 degrees with a perpendicular to the wafer. The elliptical beam had a major axis of approximately 80 microns and a minor axis of approximately 20 microns at the surface. A nitrogen flow nozzle was directed over the wafer to cool the air immediately above its surface.

The laser scan was begun in a single crystal region that was near the extremity of the wafer. The elliptical beam incident on the wafer was scanned in the <100> crystallographic direction at a rate of 1.5 centimeters per second. (The major axis of the ellipsis formed a 60 degree angle with the scan direction.) After the beam had traversed the wafer through movement of the x axis of the x-y table, the beam was shuttered and returned to a position removed by 10 microns in the y direction from the initial beam scan. The shutter was then again removed and a second pass across the wafer was completed. This repetitive shuttering and scan technique was employed until a significant portion of the wafer had been treated. The orientation of the elliptical beam in each sequential scan was that shown in FIG. 5. The treatment resulted in an essentially single crystalline material throughout the treated polycrystalline region.

EXAMPLE 2

The same procedure was followed as described in Example 1 except the laser scan direction was in the <110> crystallographic direction.

What is claimed is:

1. A process for producing a device comprising an active region of single crystal silicon overlying a region of silicon oxide comprising the steps of
    (1) forming a precursor structure that includes a region of non-single crystal silicon material which both overlies said region of silicon oxide and contacts a nucleative region of single crystal silicon wherein said precursor structure is formed from a body having an exposed surface of a region of single crystal silicon below an exposed surface of said region of silicon oxide by
        (a) selectively epitaxially depositing silicon on said region of single crystal silicon to produce said nucleating region of single crystal silicon while substantially avoiding the deposition of silicon on said region of silicon oxide until the surface of said epitaxially deposited silicon is substantially coplanar with said surface of said region of silicon oxide and (b) depositing silicon both on said region of silicon oxide and on said nucleating region of single crystal silicon and (2) converting said non-single crystal silicon region into said active region of single crystal silicon by employing said nucleating region of single crystal silicon as a nucleating site.

2. The process of claim 1 wherein said selective epitaxial deposition is performed by chemical vapor deposition utilizing an etchant for silicon and a gaseous source of silicon.

3. The process of claim 2 wherein said source of silicon is chosen from the group consisting of $SiH_4$, $SiHCl_3$, $SiH_2Cl_2$ and $SiCl_4$.

4. The process of either claim 2 or 3 wherein said etchant is chosen from the group consisting of HCl and oxygen.

5. The process of either claim 2 or 3 wherein said body is heated to a temperature in the range 1050 to 1250 degrees C. during said chemical vapor deposition.

6. The process of claim 1 wherein said conversion is accomplished by laser melting.

* * * * *